United States Patent
Zhou et al.

(10) Patent No.: US 12,100,325 B2
(45) Date of Patent: Sep. 24, 2024

(54) DISPLAY PANEL AND DISPLAY DEVICE

(71) Applicant: Wuhan China Star Optoelectronics Semiconductor Display Technology Co., Ltd., Wuhan (CN)

(72) Inventors: Ningning Zhou, Wuhan (CN); Yanan Wang, Wuhan (CN); Zengjian Jin, Wuhan (CN); Rui Ju, Wuhan (CN); Jihui Li, Wuhan (CN); Qiaoya Zhang, Wuhan (CN); Zhenbo Song, Wuhan (CN); Tengfei Ge, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/284,452

(22) PCT Filed: Feb. 25, 2021

(86) PCT No.: PCT/CN2021/077817
§ 371 (c)(1),
(2) Date: Apr. 10, 2021

(87) PCT Pub. No.: WO2022/160399
PCT Pub. Date: Aug. 4, 2022

(65) Prior Publication Data
US 2024/0130174 A1    Apr. 18, 2024

(30) Foreign Application Priority Data

Jan. 28, 2021 (CN) .......................... 202110115320.1

(51) Int. Cl.
G09G 3/00 (2006.01)
H10K 59/131 (2023.01)
H10K 102/00 (2023.01)

(52) U.S. Cl.
CPC ........... *G09G 3/035* (2020.08); *H10K 59/131* (2023.02); *H10K 2102/311* (2023.02)

(58) Field of Classification Search
CPC . G09G 3/035; H10K 59/131; H10K 2102/311
See application file for complete search history.

(56) References Cited

U.S. PATENT DOCUMENTS 10,573,226 B1   2/2020  Ma et al.
10,879,334 B2 * 12/2020  Lee ...................... H10K 59/873
(Continued)

FOREIGN PATENT DOCUMENTS

CN   204948505 U   1/2016
CN   106409149 A   2/2017
(Continued)

*Primary Examiner* — Doon Y Chow
(74) *Attorney, Agent, or Firm* — Nathan & Associates; Menachem Nathan

(57) ABSTRACT

The present invention discloses a display panel and a display device. The display panel includes a gate driver circuit and a plurality of driving wires. By disposing gate driver circuits with different distribution density in non-bending frame regions and adjusting corresponding driving wires wired from an output end of the gate driver circuit to a bending displaying region, normal driving of the bending displaying region can be achieved and simultaneously damages to the gate driver circuit during folding can be mitigated or obviated.

18 Claims, 4 Drawing Sheets

(56) References Cited

U.S. PATENT DOCUMENTS

| | | | |
|---|---|---|---|
| 11,069,266 B1* | 7/2021 | Wu | G09G 3/006 |
| 11,114,003 B2* | 9/2021 | Zheng | H10K 77/111 |
| 11,663,964 B2* | 5/2023 | Yin | G09G 3/3208 |
| | | | 345/214 |
| 2007/0171346 A1 | 7/2007 | Chang et al. | |
| 2012/0307174 A1* | 12/2012 | Lee | G09G 3/3614 |
| | | | 349/54 |
| 2014/0361262 A1 | 12/2014 | Kim | |
| 2017/0031389 A1 | 2/2017 | Yoo et al. | |
| 2019/0013486 A1 | 1/2019 | Li et al. | |
| 2019/0140198 A1* | 5/2019 | Li | H01L 27/1218 |
| 2019/0165076 A1* | 5/2019 | Lee | H10K 59/131 |
| 2020/0286416 A1 | 9/2020 | Huang et al. | |

FOREIGN PATENT DOCUMENTS

| | | |
|---|---|---|
| CN | 107862998 A | 3/2018 |
| CN | 108806511 A | 11/2018 |
| CN | 111081148 A | 4/2020 |

\* cited by examiner

DISPLAY PANEL AND DISPLAY DEVICE

FIELD OF INVENTION

The present invention relates to a field of display technologies, specifically relates to a display panel and a display device.

BACKGROUND OF INVENTION

With the continuous development of display technology, folding display terminal gradually enters people's field of vision. As known, a folding display screen in the unfolded state can obtain a larger display area and enhance the viewing effect. The folding display screen in the folded state has a small size and is convenient for users to carry. This huge advantage makes folding display screens gradually become a development trend in the display panel industry in the future. However, the folding display screen cannot avoid multiple bends during use. After the bending position of the display panel is bent for multiple times, the gate driver failure issue may easily occur, which may cause the screen to fail to receive the output signal of some gate drivers and therefore display effect is poor.

Specifically, with reference to FIG. 1, in a conventional technical solution, a gate driver circuit is in a side frame region of a display terminal. The gate driver circuit comprises a plurality of gate driver units, driver lines are wired from output terminals of corresponding gate driver units to a displaying region of the display terminal in form of straight lines. Therefore, corresponding gate driver units are required to be disposed in a bending region of the frame. However, the gate driver units, after multiple times of bending, are easily damaged to result in failure of the gate driver, which further leads to poor display.

It should be noted that the above-mentioned introduction of the background technology is only for the convenience of a clear and complete understanding of the technical solutions of the present application. Therefore, it cannot be considered that the technical solutions mentioned above are well known to those skilled in the art just because it appears in the background art of the present application.

SUMMARY OF INVENTION

Technical Issue

The present invention provides a display panel and a display device which ease an issue of easily occurred display failure in a bending region during use of a folding display terminal.

Technical Solution

In first aspect, the present invention provides a display panel, the display panel is disposed with non-bending frame regions, a bending frame region, and a bending displaying region; the display panel comprises a gate driver circuit and a plurality of driving wires; gate driver circuit comprises a plurality of gate driver units cascaded, the gate driver units are distributed in at least one of the non-bending frame regions in a first density, and the gate driver units are distributed in the bending frame region in a second density; the driving wires are correspondingly connected to the gate driver units, at least one of the driving wires is located in the bending displaying region; wherein the first density is greater than the second density; and the second density is greater than or equal to zero.

According to a first aspect, in a first embodiment of the first aspect, the bending frame region comprises a primary bending region and two bending transition regions; the primary bending region is located between two the bending transition regions; the bending transition regions is located between the primary bending region and the non-bending frame regions; the gate driver units are distributed in the bending transition regions in a third density, and the gate driver units are distributed in the primary bending region in a fourth density; wherein the first density is greater than the third density, and the third density is greater than or equal to the fourth density.

According to a first embodiment of the first aspect, in a second embodiment of the first aspect, the bending frame region further comprises a first non-bending frame sub-region and a second non-bending frame sub-region; the first non-bending frame sub-region is located between the primary bending region and one of the bending transition regions; the second non-bending frame sub-region is located between the primary bending region and one of the bending transition regions; the gate driver units are distributed in at least one of the first non-bending frame sub-region or the second non-bending frame sub-region in a fifth density; wherein the first density is greater than the fifth density, and the fifth density is greater than the third density.

According to the second embodiment of the first aspect, in a third embodiment of the first aspect, the display panel is disposed with a displaying region and a first frame region located on a side of the displaying region; the displaying region is disposed with at least two non-bending displaying regions and the bending displaying region located between adjacent two of the non-bending displaying regions; the first frame region is disposed with at least two the non-bending frame regions and a bending frame region located between adjacent two of the non-bending frame regions.

According to the third embodiment of the first aspect, in a fourth embodiment in the first aspect, b the bending displaying region and the bending frame region abut each other and are located in the same rectangular region.

According to the first aspect, in a fifth embodiment of the first aspect, at least one of the driving wires comprises a driver connection lines and a driver output line; a first end of the driver connection line is connected to a corresponding one of the gate driver units; a second end of the driver connection lines is connected to an end of the driver output line; the driver connection line is located in the first frame region; the driver output line is located in the displaying region.

According to the fifth embodiment of the first aspect, in a sixth embodiment of the first aspect, at least one of the driver connection lines is located in the non-bending frame regions and/or the bending frame region; at least one of the driver output lines is located in the bending displaying region.

According to a fifth embodiment of the first aspect, in a seventh embodiment of the first aspect, each of the driver connection lines comprises a first driver connection portion, a second driver connection portion, and a third driver connection portion that are connected sequentially; the first driver connection portion parallels the third driver connection portion; the second driver connection portion intersects at least one of the first driver connection portion and the third driver connection portion.

According to the first aspect, in an eighth embodiment in the first aspect, adjacent two of the gate driver units are cascaded.

According to the eighth embodiment of the first aspect, in a ninth embodiment in the first aspect, the display panel is disposed with at least two the non-bending frame regions; each of the non-bending frame regions has the same or similar amount of the gate driver units.

According to any one of the above embodiments, in a tenth embodiment of the first aspect, a bendable radius of the bending displaying region is R, a width of each of the gate driver units is W, and an amount of the driving wires in the bending displaying region ranges from $2\pi R/W-100$ to $2\pi R/W+100$.

In a second aspect, the present invention provides a display panel, the display panel is disposed with a non-bending frame regions, a bending frame region and a bending displaying region; the display panel comprises: a gate driver circuit, the gate driver circuit comprising a plurality of gate driver units cascaded and arranged in the same column, the gate driver units are distributed in at least one of the non-bending frame regions in a first density, and the gate driver units are distributed in the bending frame region in a second density; and a plurality of driving wires, the driving wires correspondingly connected to the gate driver units, and at least one of the driving wires located in the bending displaying region; wherein the first density is greater than the second density; and the second density is greater than or equal to zero.

In a third aspect, the present invention provides a display device comprising the display panel as described in any one of the above embodiments.

Advantages

The display panel and the display device provided by present invention, by disposing gate driver circuits of different densities in a bending frame region and non-bending frame regions and adjusting wiring of driving wires from an output end of the gate driver circuit to the bending displaying region, not only achieves normal driving of the bending displaying region but also reduces or avoids damages to the gate driver circuits during folding, which can ease or obviate the issue of failure of the bending region display.

DETAILED DESCRIPTION OF PREFERRED EMBODIMENTS

To make the objective, the technical solution, and the effect of the present invention clearer and more explicit, the present invention will be further described in detail below with reference to the accompanying drawings. It should be understood that the specific embodiments described here are only used to explain the present invention instead of being used to limit the present invention.

Figure 1:
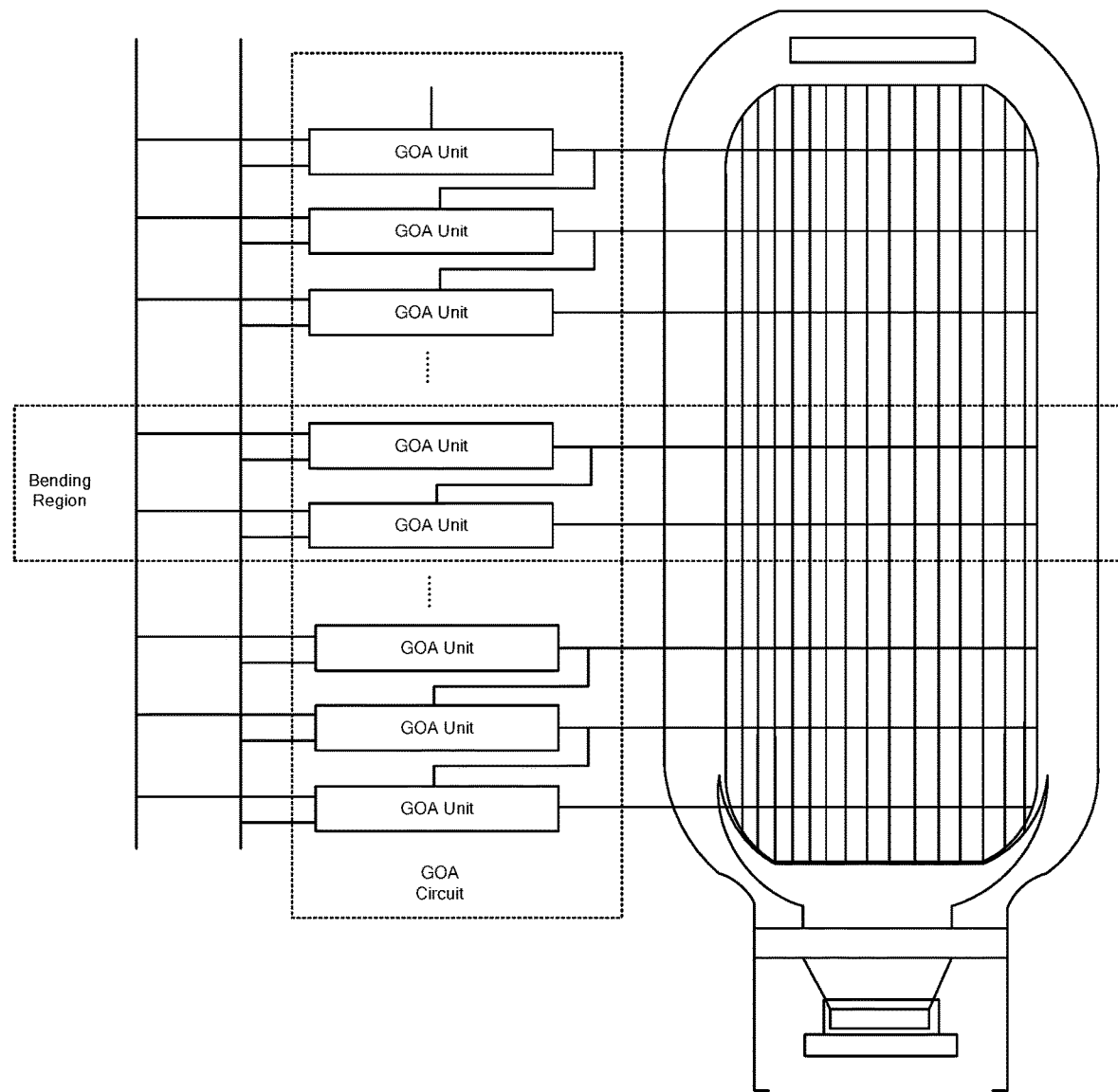
FIG. 1 is a schematic structural view of a display panel of a conventional technical solution.
Figure 2:
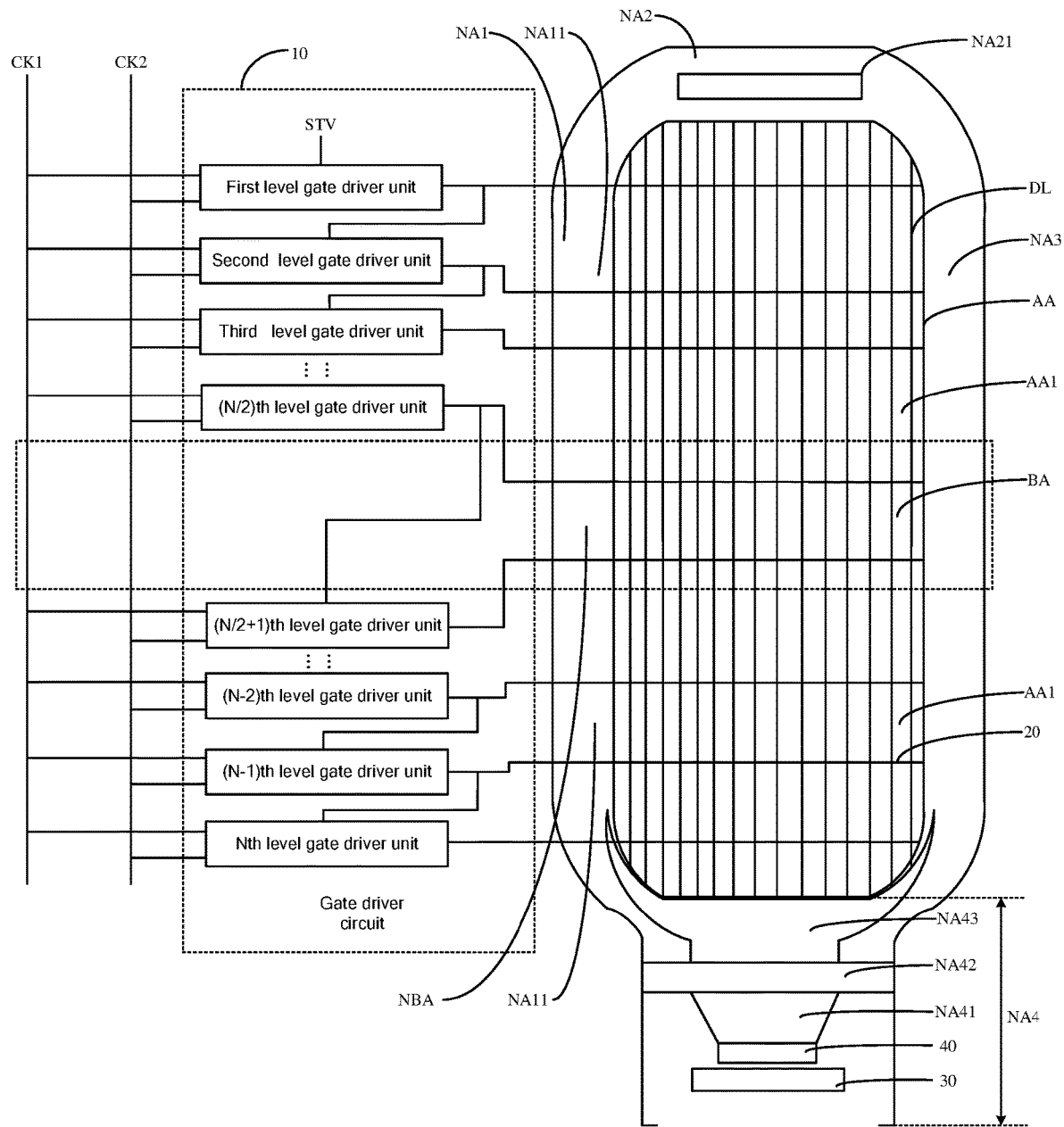
FIG. 2 is a schematic structural view of the display panel provided by the embodiment of the present invention.
Figure 3:
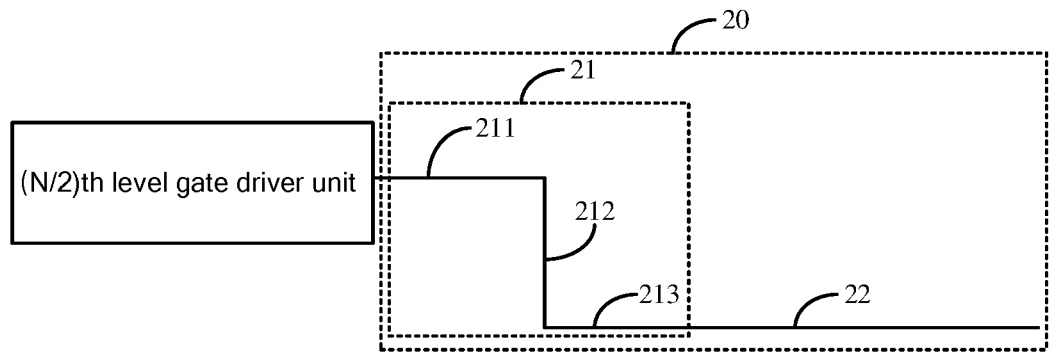
FIG. 3 is a first schematic structural view of driving wires in FIG. 2.
Figure 4:
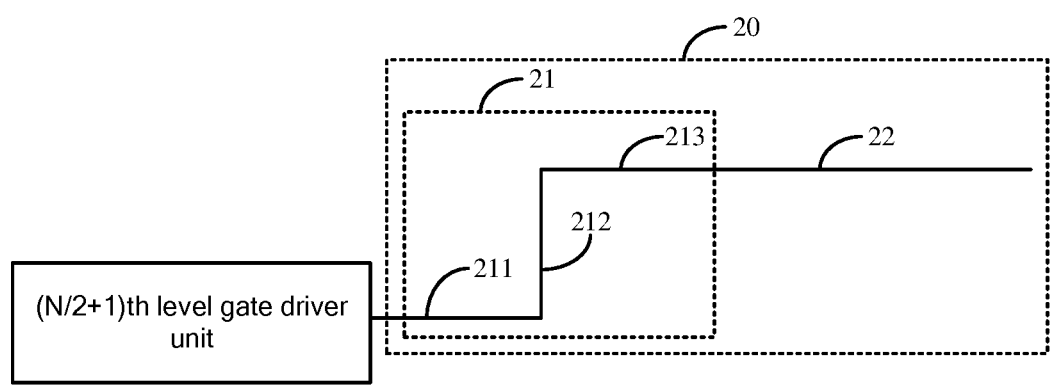
FIG. 4 is a second schematic structural view of the driving wires in FIG. 2.

With reference to FIGS. 2 to 4, as shown in FIG. 2, the embodiment of the present invention provides a display panel, the display panel is disposed with a displaying region AA and a first frame region NA1 located on a side of the displaying region AA. The displaying region AA is disposed with at least two non-bending displaying regions AA1 and a bending displaying region BA located between adjacent two of the non-bending displaying regions AA1. The first frame region NA1 is disposed with at least two non-bending frame regions NA11 and a bending frame region NBA located between adjacent two of the non-bending frame regions NA11. The display panel comprises a gate driver circuit 10 and a plurality of driving wires 20. The gate driver circuit 10 comprises a plurality of gate driver units cascaded. The gate driver units are distributed in at least one of the non-bending frame regions NA11 in a first density, and gate driver units are distributed in the bending frame region NBA in a second density. The driving wires 20 are correspondingly connected to the gate driver units, and at least one of the driving wires 20 is located in the bending displaying region BA. The first density is greater than second density, and the second density is greater than or equal to zero.

It should be explained that a corresponding density of the embodiment of the present invention can be but not limited to quotient of an area of a corresponding region divided by an amount of the gate driver units in the corresponding region. For example, the first density can be: a quotient of an area of the non-bending frame regions NA11 divided by an amount of the gate driver units in the non-bending frame regions NA11. The first density can also be expressed by an interval between adjacent two of the gate driver units. Therefore, it can be understood that when a density of the gate driver units is less, the interval between adjacent two of the gate driver units is greater, and such condition can ease bending damages of the gate driver circuit 10.

The gate driver circuit 10 in the embodiment of the present invention can be but is not limited to a gate driver on array (GOA) type scan driver circuit, and outputs corresponding scan signals. The gate driver circuit 10 can also be a GOA type light emitting driver circuit, and outputs corresponding light emitting control signals. As such, it can be understood that the gate driver circuit 10 can also be other type of GOA driver circuit, and can output corresponding driver signals for driving the display panel. Therefore, the gate driver circuit 10 in the embodiment of the present invention can comprise at least one of the above driver circuits.

It can be understood that the display panel provided by the present invention, by disposing gate driver circuits of different densities in a bending frame region NBA and non-bending frame regions NA11 and adjusting wiring of driving wires 20 from an output end of the gate driver circuit 10 to the bending displaying region BA, not only achieves normal driving of the bending displaying region BA but also reduces or avoids damages to the gate driver circuits during folding, which can ease or obviate the issue of failure of the bending region display.

In one of the embodiments, the display panel can further comprise at least one of a second frame region NA2, a third frame region NA3, or a fourth frame region NA4. Specifically, first frame region NA1 can be but is not limited to a frame region on a left side of the displaying region AA. The second frame region NA2 can be but is not limited to a frame region on an upper side of the displaying region AA. The third frame region NA3 can be but is not limited to a frame region on a right side of the displaying region AA. fourth frame region NA4 can be but is not limited to a frame region on a lower side of the displaying region AA.

It can be understood that the first frame region NA1 and the third frame region NA3 can be two frame regions disposed opposite to each other, and both have the same shape and/or area. The second frame region NA2 and the fourth frame region NA4 can be two frame regions disposed opposite to each other, and both have different shapes and/or areas. For example, an area of the fourth frame region NA4 can be greater than an area of the second frame region NA2. In the display panel, a transition region between adjacent two of the frame regions includes an arc edge such that the display panel can achieve an arc angle having an elegant curve.

It can be understood that arrangement of the first frame region NA1, the second frame region NA2, the third frame region NA3, and the fourth frame region NA4 of the display panel can be adjusted depending on demands for different needs of different display products.

In one of the embodiments, a dummy pixel region NA21 can be disposed on the second frame region NA2, the dummy pixel region NA21 can be disposed with but is not limited to corresponding pixels. However, the pixels do not receive corresponding driver signal and/or data signal. Namely, corresponding driving wires 20 and/or data lines DL are not disposed in the dummy pixel region NA21.

In one of the embodiments, the fourth frame region NA4 is disposed with at least one of a chip-on-film package 30, a cell-test circuit 40 (function test circuit in a cell stage), a first fan-out wiring region NA41, a bending region NA42, or a second fan-out wiring region NA43. The cell-test circuit 40 (function test circuit in a cell stage), the first fan-out wiring region NA41, and the bending region NA42 are located between the chip-on-film package 30 and the second fan-out wiring region NA43. A distance between the second fan-out wiring region NA43 and the displaying region AA is less than other distance in the fourth frame region NA4. A distance between the chip-on-film package 30 and the displaying region AA is greater than the distance of the fourth frame region NA4. The bending region NA42 is located between the first fan-out wiring region NA41 and the second fan-out wiring region NA43. The first fan-out wiring region NA41 is located between the chip-on-film package 30 and the bending region NA42. The first fan-out wiring region NA41 can be trapezoidal. The second fan-out wiring region is irregular-shaped, and at least comprises an arc portion, and the arc portion is disposed opposite to the arc angle of the display panel.

In one of the embodiments, the display panel also has data lines DL disposed in the displaying region AA and intersecting the driving wires 20. Such data lines DL are evenly distributed along a width direction of the display panel.

In one of the embodiments, a first clock signal line CK1 and a second clock signal line CK2 are also disposed in a first frame region NA1 of the display panel, are located on a side of the gate driver circuit 10 and away from the displaying region AA. Each of the gate driver units is linked to the first clock signal line CK1 and the second clock signal line CK2. The second clock signal line CK2 is located between the first clock signal line CK1 and the gate driver circuit 10.

In one of the embodiments, the bending displaying region BA and the bending frame region NBA can abut each other and be in the same rectangular region. Specifically, the bending displaying region BA and the bending frame region NBA have the same width region along a length direction of the display panel, and the bending displaying region BA and the bending frame region NBA, along a width direction or a non-bending direction of the display panel, have overlapped orthographic projections on a certain plane. As such, the displaying region AA and the frame region of the display panel can have a consistent bendable radius.

In one of the embodiments, a bendable radius in the bending frame region NBA and/or the bending displaying region BA is R, a width of each of the gate driver units is W, and then an amount range of the driving wires 20 in the bending displaying region BA is $2\pi R/W-100$ to $2\pi R/W+100$. Specifically, the amount range of the driving wires 20 in the bending displaying region BA can also be an amount of an integer according to $2\pi R/W$.

It can be understood that based on the above analysis, the amount of the driving wires 20 in the bending displaying region BA can be confirmed conveniently, which provides more specifical reference design for distribution of the gate driver circuit 10 and the driving wires 20 on the display panel.

For example, in the embodiment, the gate driver units of the bending frame region NBA can be squeezed and arranged toward the non-bending frame regions NA11, the bending frame region NBA has no gate driver units and only has corresponding wires, which avoids too many times of folding resulting in crack of the wires and/or device in the gate driver units and leading to failure of the gate driver.

Specifically, in the embodiment of the present invention, a width of each of the gate driver units can be but is not limited to 0.05 mm to 0.09 mm, Specifically, the width can be one of 0.06 mm, 0.07 mm, and 0.08 mm.

In one of the embodiments, the display panel can also be a display panel achieving a droplet folding function. The bendable radius of the display panel can be but is not limited to 1 mm to 5 mm. Specifically, the bendable radius thereof can also be one of 2 mm, 3 mm, and 4 mm. Accordingly, when a width of the gate driver unit is 0.07 mm, and the bendable radius is 3 mm, an amount of the gate driver units required to be moved and squeezed to the non-bending frame regions NA11 is about $(2\pi*3)/0.07$, namely, about 269 gate driver units are required to be moved from the bending frame region NBA to the non-bending frame regions NA11.

In one of the embodiments, the bending displaying region BA and the bending frame region NBA can be located in different rectangular regions. Specifically, the bending displaying region BA and the bending frame region NBA have different width regions along the length direction of the display panel, and the bending displaying region BA and the bending frame region NBA, along the width direction of the display panel, have overlapped orthographic projections on a certain plane such that the displaying region AA and the frame region of the display panel can achieve asymmetrical folding in a greater extent.

In one of the embodiments, the gate driver units can be but are not limited to the same column, and adjacent two of the gate driver units are cascaded.

Specifically, with reference to FIG. 2, the gate driver circuit 10 comprises a first level gate driver unit, a second level gate driver unit, a third level gate driver unit to (N/2)th level gate driver unit, a ((N/2)+1)th level gate driver unit to a (N−2)th gate driver unit, a (N−1)th level gate driver unit, and a $N^{th}$ level gate driver unit. The first level gate driver unit is connected to an initial signal line STV. For example, the first level gate driver unit and the second level gate driver unit are cascaded. The second level gate driver unit and the third level gate driver unit are cascaded. The N is an integer greater than or equal to 1.

In one of the embodiments, the first frame region NA1 of the display panel is disposed with at least two non-bending frame regions NA11. Each of the non-bending frame regions NA11 has the same or similar amount of gate driver units. For example, one of the non-bending frame regions NA11 is disposed with an amount "N/2" of gate driver units, the other non-bending frame regions NA11 is also disposed with an amount "N/2" of gate driver units. The two non-bending frame regions NA11 have the same amount of the gate driver units, which can achieve symmetrical design of the two non-bending frame regions NA11, lower complexity of design, and simplify manufacturing processes. Of course, the two non-bending frame regions NA11 can also be disposed with similar amounts of the gate driver units respectively. For example, the amount of the gate driver units in one of the non-bending frame regions NA11 is one or two more than the amount of the gate driver units of the other non-bending frame regions NA11. Such condition can satisfy non-standard design of the gate driver units or spare gate driver units needed.

With reference to FIG. 2, In one of the embodiments, the driving wires 20 connected to the first level gate driver units and the $N^{th}$ level gate driver units are straight line as a whole and have no corresponding folding line portions. With reference to FIG. 3 or FIG. 4, for other gate driver units of the first level gate driver units and the $N^{th}$ level gate driver units, at least one of the corresponding driving wires 20 comprises a driver connection line 21 and a driver output line 22. A first end of the driver connection line 21 is connected to a corresponding one of the gate driver units. A second end of the driver connection line 21 is connected to an end of the driver output lines 22. The driver connection lines 21 is located in the first frame region NA1. The driver output lines 22 is located in the displaying region AA.

In one of the embodiments, at least one driver connection lines 21 are located in the non-bending frame regions NA11 and/or the bending frame region NBA. The at least one driver output lines 22 is located in the bending displaying region BA.

It can be understood that the driver output lines 22 are located in the displaying region AA or the bending displaying region BA and can provide driver signals for the pixels in the displaying region AA to achieve normal display driving.

In one of the embodiments, the driver connection lines 21 can be but is not limited to folding lines, and can also be curved lines.

In one of the embodiments, the folding line type driver connection lines 21 comprises a first driver connection portion 211, a second driver connection portion 212, and a third driver connection portion 213 that are sequentially connected to one another. The first driver connection portion 211 parallels third driver connection portion 213. The second driver connection portion 212 intersects at least one of the first driver connection portion 211 or the third driver connection portion 213.

Specifically, second driver connection portion 212 can be but is not limited to perpendicular to at least one of the first driver connection portion 211 or the third driver connection portion 213. The second driver connection portion 212 can also be obliquely disposed and intersect at least one of the first driver connection portion 211 and the third driver connection portion 213.

Specifically, with reference to FIG. 3, in upper non-bending frame regions, the first driver connection portion 211 is located on an upper side of the third driver connection portion 213 can achieve even distribution or approximately even distribution of the driving wires 20 in the displaying region AA under a condition of more densely distributed gate driver units. For example, the gate driver units before (N/2)th level gate driver units can be distributed by using such condition.

With reference to FIG. 4, in lower non-bending frame regions NA11, the first driver connection portion 211 is located on a lower side of the third driver connection portion 213, which can achieve even distribution or approximately even distribution of the driving wires 20 in the displaying region AA under a condition of the more densely distributed gate driver units. For example, the gate driver units after the ((N/2)+1)th level gate driver units can use such distribution under the above condition.

Figure 5:
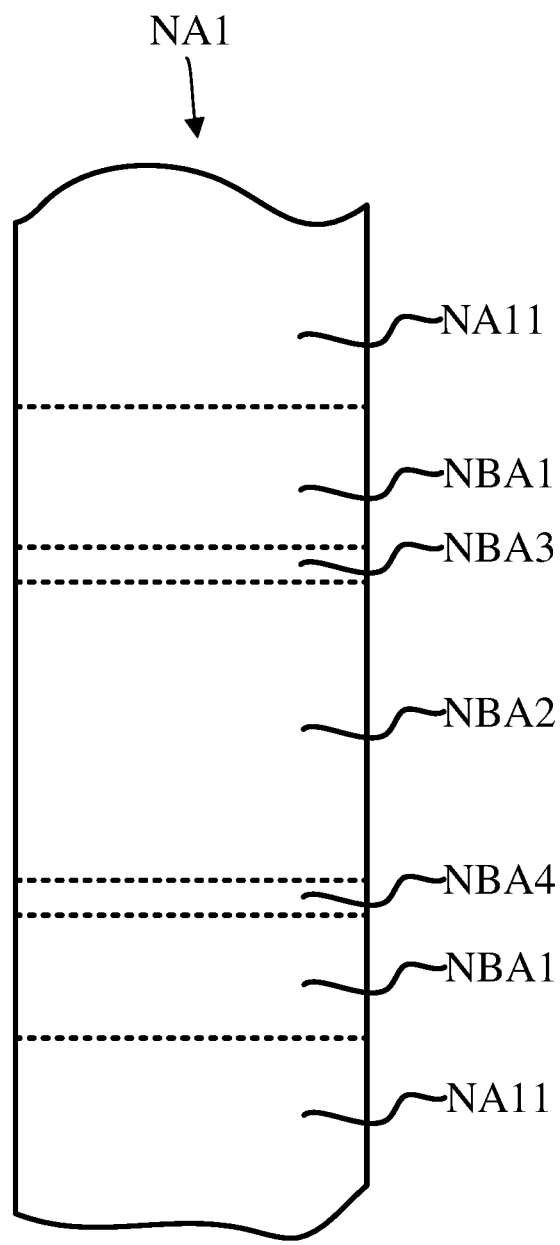
FIG. 5 is a schematic structural view of the first frame region in FIG. 2.

With reference to FIG. 5, In one of the embodiments, bending frame region NBA comprises a primary bending region NBA2 and two bending transition regions NBA1. The primary bending region NBA2 is located between two bending transition regions NBA1. The bending transition regions NBA1 is located between the primary bending region NBA2 and the non-bending frame regions NA11. The gate driver units are distributed in the bending transition regions NBA1 in a third density, and the gate driver units are distributed in the primary bending region NBA2 in a fourth density. The first density is greater than the third density, and the third density is greater than or equal to the fourth density.

The fourth density can be equal to but is not limited to zero, and can also be greater than zero.

It should be explained that compared to primary bending region NBA2, the bending transition regions NBA1 suffer less stress during bending and are more suitable for disposing the gate driver circuit 10 in the corresponding region.

With reference to FIG. 5, In one of the embodiments, bending frame region NBA further comprises a first non-bending frame sub-region NBA3 and a second non-bending frame sub-region NBA4. The first non-bending frame sub-region NBA3 is located between the primary bending region NBA2 and one of the bending transition regions NBA1. The second non-bending frame sub-region NBA4 is located between the primary bending region NBA2 and the other of the bending transition regions NBA1. The gate driver units are distributed in at least one of the first non-bending frame sub-region NBA3 or the second non-bending frame sub-region NBA4 in a fifth density. The first density is greater than the fifth density, and the fifth density is greater than the third density.

It should be explained that the first non-bending frame sub-region NBA3 and the second non-bending frame sub-region NBA4, during bending, would not suffer stress basically, and the stress applied thereto can almost be ignored compared to a normal non-bending region. Therefore, the gate driver circuit 10 in the first non-bending frame sub-region NBA3 and the second non-bending frame sub-region NBA4 can reduce or eliminate bending damages of the gate driver circuit 10.

In one of the embodiments, the embodiment of the present invention provides a display device, comprises the display panel of any one of the above embodiments. The display device can be but is not limited to a folding computer or a folding cell phone.

It can be understood that the display device provided by the present invention, by disposing gate driver circuits of different densities in a bending frame region NBA and non-bending frame regions NA11 and adjusting wiring of driving wires 20 from an output end of the gate driver circuit 10 to the bending displaying region BA, not only achieves normal driving of the bending displaying region BA but also reduces or avoids damages to the gate driver circuits during folding, which can ease or obviate the issue of failure of the bending region display.

The above display panel can be but is not limited to an organic light emitting diode (OLED) display screen, and is a display screen made by organic self-light emitting diodes. Because of inclusion of organic self-light emitting diodes, it needs no backlight source, and has advantages such as high contrast, thinness, wide angle of view, and fast response, and applicability for flexible display panels, extensive range of working temperature, simplified structures and processes, which is considered as a new flat panel display technology of next generation.

It can be understood that for a person of ordinary skill in the art, equivalent replacements or changes can be made according to the technical solution of the present invention and its inventive concept, and all these changes or replacements should belong to the scope of protection of the appended claims of the present invention.

What is claimed is:

1. A display panel, wherein the display panel is disposed with non-bending frame regions, a bending frame region and a bending displaying region; the display panel comprises:
    a gate driver circuit, the gate driver circuit comprising a plurality of gate driver units cascaded, the gate driver units distributed in at least one of the non-bending frame regions in a first density, and the gate driver units distributed in the bending frame region in a second density; and
    a plurality of driving wires, the driving wires correspondingly connected to the gate driver units, and at least one of the driving wires located in the bending displaying region;
    wherein the first density is greater than the second density; and the second density is greater than or equal to zero; and
    wherein the bending frame region comprises a primary bending region and two bending transition regions; the primary bending region is located between two the bending transition regions; the bending transition regions is located between the primary bending region and the non-bending frame regions; the gate driver units are distributed in the bending transition regions in a third density, and the gate driver units are distributed in the primary bending region in a fourth density; wherein the first density is greater than the third density, and the third density is greater than or equal to the fourth density.

2. The display panel as claimed in claim 1, wherein the bending frame region further comprises a first non-bending frame sub-region and a second non-bending frame sub-region; the first non-bending frame sub-region is located between the primary bending region and one of the bending transition regions; the second non-bending frame sub-region is located between the primary bending region and one of the bending transition regions; the gate driver units are distributed in at least one of the first non-bending frame sub-region or the second non-bending frame sub-region in a fifth density;
    wherein the first density is greater than the fifth density, and the fifth density is greater than the third density.

3. The display panel as claimed in claim 2, wherein the display panel is disposed with a displaying region and a first frame region located on a side of the displaying region; the displaying region is disposed with at least two non-bending displaying regions and the bending displaying region located between adjacent two of the non-bending displaying regions; the first frame region is disposed with at least two the non-bending frame regions and a bending frame region located between adjacent two of the non-bending frame regions.

4. The display panel as claimed in claim 3, wherein the bending displaying region and the bending frame region abut each other and are located in the same rectangular region.

5. The display panel as claimed in claim 1, wherein at least one of the driving wires comprises a driver connection lines and a driver output line; a first end of the driver connection line is connected to a corresponding one of the gate driver units; a second end of the driver connection lines is connected to an end of the driver output line; the driver connection line is located in the first frame region; the driver output line is located in the displaying region.

6. The display panel as claimed in claim 5, wherein at least one of the driver connection lines is located in the non-bending frame regions and/or the bending frame region; at least one of the driver output lines is located in the bending displaying region.

7. The display panel as claimed in claim 5, wherein each of the driver connection lines comprises a first driver connection portion, a second driver connection portion, and a third driver connection portion that are connected sequentially; the first driver connection portion parallels the third driver connection portion; the second driver connection portion intersects at least one of the first driver connection portion and the third driver connection portion.

8. The display panel as claimed in claim 1, wherein adjacent two of the gate driver units are cascaded.

9. The display panel as claimed in claim 8, wherein the display panel is disposed with at least two the non-bending frame regions; each of the non-bending frame regions has the same or similar amount of the gate driver units.

10. The display panel as claimed in claim 1, wherein a bendable radius of the bending displaying region is R, a width of each of the gate driver units is W, and an amount of the driving wires in the bending displaying region ranges from $2\pi R/W-100$ to $2\pi R/W+100$.

11. A display device, comprising the display panel as claimed in claim 1.

12. A display panel, wherein the display panel is disposed with a non-bending frame regions, a bending frame region and a bending displaying region; the display panel comprises:
    a gate driver circuit, the gate driver circuit comprising a plurality of gate driver units cascaded and arranged in the same column, the gate driver units are distributed in at least one of the non-bending frame regions in a first density, and the gate driver units are distributed in the bending frame region in a second density; and
    a plurality of driving wires, the driving wires correspondingly connected to the gate driver units, and at least one of the driving wires located in the bending displaying region;
    wherein the first density is greater than the second density; and the second density is greater than or equal to zero; and
    wherein the bending frame region comprises a primary bending region and two bending transition regions; the primary bending region is located between two the bending transition regions; the bending transition regions is located between the primary bending region and the non-bending frame regions; the gate driver units are distributed in the bending transition regions in a third density, and the gate driver units are distributed in the primary bending region in a fourth density; wherein the first density is greater than the third density, and the third density is greater than or equal to the fourth density.

13. The display panel as claimed in claim 12, wherein the bending frame region further comprises a first non-bending frame sub-region and a second non-bending frame sub-region; the first non-bending frame sub-region is located between the primary bending region and one of the bending transition regions; the second non-bending frame sub-region is located between the primary bending region and one of the bending transition regions; the gate driver units are distributed in at least one of the first non-bending frame sub-region or the second non-bending frame sub-region in a fifth density;

wherein the first density is greater than the fifth density, and the fifth density is greater than the third density.

14. The display panel as claimed in claim 13, wherein the display panel is disposed with a displaying region and a first frame region located on a side of the displaying region; the displaying region is disposed with at least two non-bending displaying regions and the bending displaying region located between adjacent two of the non-bending displaying regions; the first frame region is disposed with at least two the non-bending frame regions and a bending frame region located between adjacent two of the non-bending frame regions.

15. The display panel as claimed in claim 14, wherein the bending displaying region and the bending frame region abut each other and are located in the same rectangular region.

16. The display panel as claimed in claim 12, wherein at least one of the driving wires comprises a driver connection lines and a driver output line; a first end of the driver connection line is connected to a corresponding one of the gate driver units; a second end of the driver connection lines is connected to an end of the driver output line; the driver connection line is located in the first frame region; the driver output line is located in the displaying region.

17. The display panel as claimed in claim 16, wherein at least one of the driver connection lines is located in the non-bending frame regions and/or the bending frame region; at least one of the driver output lines is located in the bending displaying region.

18. The display panel as claimed in claim 16, wherein each of the driver connection lines comprises a first driver connection portion, a second driver connection portion, and a third driver connection portion that are connected sequentially; the first driver connection portion parallels the third driver connection portion; the second driver connection portion intersects at least one of the first driver connection portion and the third driver connection portion.

* * * * *